United States Patent [19]

Rainal

[11] Patent Number: 5,304,856
[45] Date of Patent: Apr. 19, 1994

[54] ARTICLE COMPRISING A BALANCED DRIVER CIRCUIT WITH LESS POWER DISSIPATION THAN CONVENTIONAL CIRCUIT

[75] Inventor: Attilio J. Rainal, Morristown, N.J.

[73] Assignee: AT&T Bell Laboratories, Murray Hill, N.J.

[21] Appl. No.: 992,514

[22] Filed: Dec. 17, 1992

[51] Int. Cl.$^5$ .............................................. H01P 5/00
[52] U.S. Cl. ........................................ 307/270; 333/4; 333/5; 307/303
[58] Field of Search ................... 307/270, 303; 333/4, 333/5

[56] References Cited

U.S. PATENT DOCUMENTS

| | | | |
|---|---|---|---|
| 2,630,558 | 3/1953 | Arsem et al. | 333/5 |
| 3,585,399 | 6/1971 | Andrews, Jr. | 307/270 |
| 4,029,971 | 6/1977 | Pryor | 307/270 |
| 4,707,672 | 11/1987 | Duret et al. | 333/4 |

OTHER PUBLICATIONS

F100K ECL Logic Databook and Design Guide, Section 7, Chapter 1, p. 7-3 (1990).
R. C. Foss, et al, "Fast interfaces for DRAMs", *IEEE Spectrum*, pp. 54-57, (1992).
T. J. Gabara, et al, "Digitally Adjustable Resistors in CMOS for High-Performance Applications", *IEEE Journal of Solid-State Circuits*, vol. 27, No. 8 (1992).
A. E. Dunlop, et al. "A 9 Gbit/s Bandwidth Muliplexer/Demultiplexer CMOS Chip", *IEEE Symposium on VLSI Circuits*, pp. 68-69 (1992).

Primary Examiner—William L. Sikes
Assistant Examiner—Toan Tran
Attorney, Agent, or Firm—Eileen D. Ferguson

[57] ABSTRACT

By on-chip modification of a conventional balanced driver to yield special voltage levels, the power dissipation of a balanced, terminated transmission line circuit can be reduced by 50% or more relative to a conventional balanced driver or 25% or more relative to a conventional unbalanced driver. This reduction in power dissipation not only applies to point-to-point interconnections but also applies to bused interconnections. The low power balanced driver circuit can be implemented using ECL, BiCMOS, GaAs and CMOS technologies and no modifications are needed to the associated differential line receiver. Thus, the significant benefits of balanced interconnections, namely reduced crosstalk, increased noise immunity, and elimination of ground noise can be realized with a significant reduction in power dissipation.

10 Claims, 3 Drawing Sheets

ARTICLE COMPRISING A BALANCED DRIVER CIRCUIT WITH LESS POWER DISSIPATION THAN CONVENTIONAL CIRCUIT

FIELD OF THE INVENTION

This invention relates to integrated circuits and more specifically to balanced driver circuits.

BACKGROUND OF THE INVENTION

A major performance limitation of electrical interconnections is inductive noise encountered when one interconnects high-speed, high pin-out integrated circuit (IC) chips having many drivers that switch simultaneously. When a large number of drivers are active simultaneously, a substantial transient current passes through the inductance of the ground and power distribution systems, causing a noise spike to emerge on the power and ground lines. The resulting fluctuation of the power and ground voltage levels can cause false switching of devices with an accompanying error or loss of data. As "Fast interfaces for DRAMs," *IEEE Spectrum*, October 1992, pp. 52-57, shows, there exists a recognized need for improved interfaces between, e.g., DRAMs and processors, especially low cost interfaces that can have low power dissipation.

Various techniques for reducing inductive switching noise on ground leads are known. They include the use of balanced IC driver circuits. However, conventional balanced IC driver circuits typically dissipate twice the power of corresponding unbalanced drivers. This clearly is a significant disadvantage. As can be seen from "Fast Interfaces for DRAMs" and problems experienced in the field, there is a long felt need for a technique which will drive a circuit, produce a minimal amount of inductive noise and dissipates a minimal amount of power.

Recently, a balanced driver circuit with reduced power dissipation was disclosed in U.S. patent application Ser. No. 07/895767 entitled "Balanced Driver Circuit For Eliminating Inductive Noise" filed on Jun. 9, 1992, which is incorporated herein by reference. The circuit of the '767 application can reduce the power dissipation of a balanced driver to the level of that of an unbalanced driver, but has the drawback of requiring additional off-chip components. It would be highly desirable to have available a balanced driver circuit that can have still lower power dissipation, preferably without requiring additional components. This application discloses such a circuit.

SUMMARY OF THE INVENTION

This invention is embodied in an article that comprises a low power balanced driver circuit which essentially eliminates inductive noise while at the same time significantly reduces the power dissipation relative to conventional balanced or unbalanced driver circuits. The inventive balanced driver circuit, using ECL (emitter coupled logic), or BiCMOS (bipolar complementary metal-oxide semiconductor) technology, typically comprises two emitter follower output stages connected in series to a pair of signal leads, respectively. Terminating the signal leads are two termination resistors. A voltage supply having a voltage designated by $-V_T$ is connected between the termination resistors and a receiver is connected in parallel with the termination resistors. Surprisingly, it was discovered that there exist ranges of the relevant circuit parameters (including $V_T$ voltage levels, $V_1$ and $V_2$), which can result in substantially reduced power dissipation while avoiding IC performance degradations. For the first time, one can utilize a low power balanced driver circuit not only to reduce inductive noise but to reduce power dissipation relative to a comparable unbalanced or balanced driver circuit. In general, $V_T$ is in the approximate range of 1.0 to 1.5 V and the voltage swing, $\Delta V$, is in the approximate range of 0.125 to 0.375 V. The value of $V_1$ is realized by applying $V_T$ approximately in the range of 1.0 to 1.5 V, rather than the normal 2.0 V, between the termination resistors. The value of $V_2 = V_1 + \Delta V$ is realized by changing the value of internal resistors and/or changing the magnitude of internal current and/or voltage sources. This design can also be implemented in CMOS (complementary metal oxide semiconductor) or GaAs technologies. The driver can be used for driving point-to-point interconnections as well as bused interconnections.

DETAILED DESCRIPTION

Figure 1:
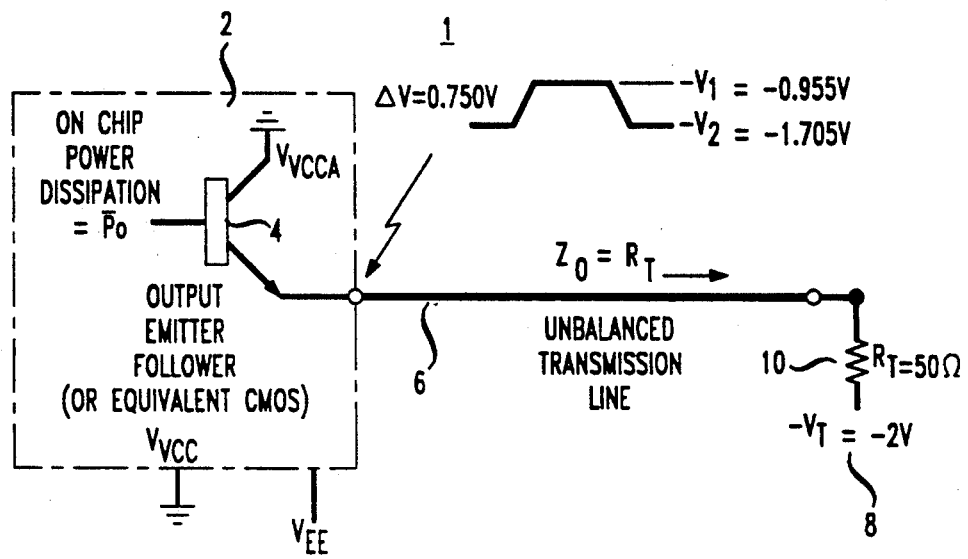
FIG. 1 illustrates a conventional unbalanced transmission line driver.

Referring to the drawings, FIG. 1 schematically illustrates the output portion of a conventional driver used to drive a terminated, unbalanced transmission line. Only the AC portion of the unbalanced driver circuit 1 is displayed. The unbalanced driver circuit 1 is comprised of an emitter follower output stage 4, positioned on an integrated circuit 2, a transmission line 6 which has an impedance designated by $Z_O$, a termination resistor 10 which has a value designated by $R_T$, typically equal to 50 Ω, and a voltage supply 8 which has a voltage designated by $-V_T$, typically equal to $-2$ V. The average on-chip power dissipated by the unbalanced driver circuit 1 less the power dissipated by the output emitter follower 4 is denoted by $\overline{P}_o$. The typical ECL voltage swing for an unbalanced driver circuit 1 is, $\Delta V = 0.750$ V, where the voltage levels are approximately $V_1 = -0.955$ V, and $V_2 = -1.705$ V.

The total average power dissipation, $\overline{P}_{Ut}$, attributed to the unbalanced driver 1 is given by $$\overline{P}_{Ut} = \overline{P}_U + \overline{P}_o \qquad (1)$$

where $\overline{P}_U$ denotes the average power dissipation of the output emitter follower 4 and the termination resistor 10 as given by $$\overline{P}_U = \frac{V_T}{2R_T} [2V_T - V_2 - V_1]. \qquad (2)$$

Figure 4:
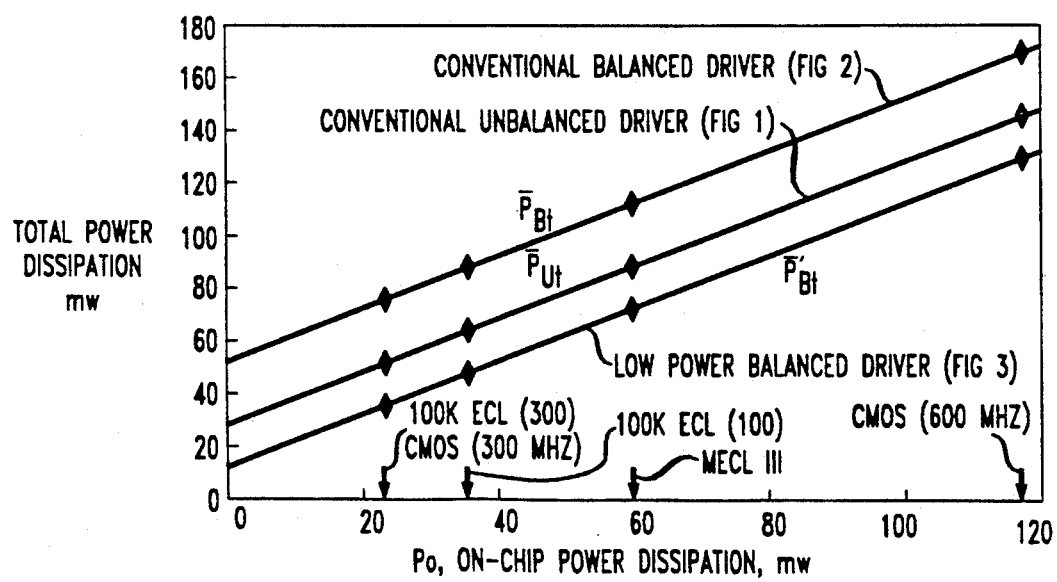
FIG. 4 illustrates a comparison of the total power dissipation of the low power balanced driver with comparable, conventional balanced and unbalanced drivers.

$\overline{P}_{Ut}$ as a function of $\overline{P}_o$ is plotted in FIG. 4.

Figure 2:
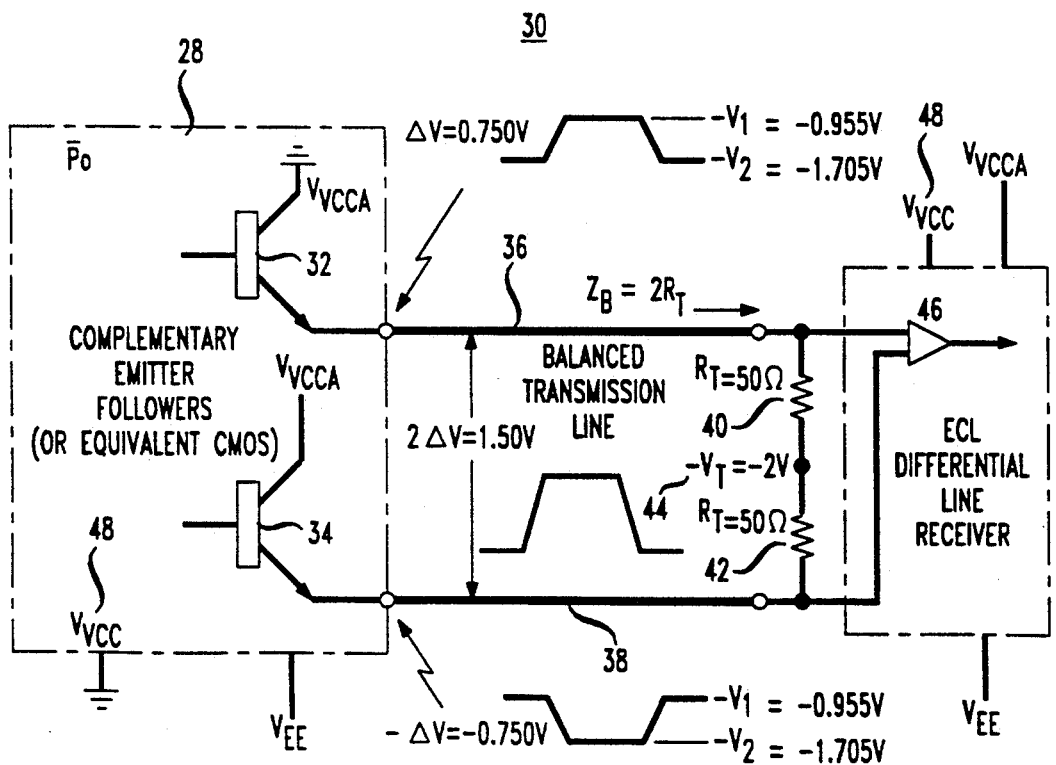
FIG. 2 illustrates a conventional balanced transmission line driver.

FIG. 2 schematically, illustrates the conventional method used to drive a terminated, balanced transmission line. Only the AC portion of the balanced driver circuit 30 is displayed. The balanced driver 30 is comprised of two emitter follower output stages 32 and 34 which are each connected in series to either a primary or secondary signal lead 36 and 38 which together is referred to as a balanced transmission line having a balanced impedance designated by $Z_B$. Terminating the balanced transmission line 36 and 38 are termination resistors 40 and 42 which have values designated as $R_T$ typically equal to 50 Ω. A voltage supply 44 which has a voltage designated by $-V_T$, typically equal to $-2$ V, is connected to the center-tap of the termination resistors 40 and 42. A receiver 46 is connected in parallel with the termination resistors 40 and 42. The pair of signal leads 36 and 38 are connected to the emitter follower output stages 32 and 34, respectively, located on the integrated circuit 28 so that the current traversing the secondary lead 38 has the same amplitude, but the opposite sign as the current traversing the primary lead 36. Thus, there is negligible current return through the common ground leads 48. The voltage swing and voltage levels at the output of the emitter followers 32 and 34 of the conventional balanced driver circuit 30 are typically equal to the corresponding voltage swing and voltage levels of the conventional unbalanced driver circuit; e.g. $\Delta V = 0.750$ V, $-V_1 = -0.955$ V and $-V_2 = -1.705$ V. The average on-chip power dissipated by the balanced driver circuit 30 less the power dissipated by the two output emitter followers 32 and 34 also equals $\bar{P}_o$. Because a balanced driver circuit is essentially comprised of two unbalanced driver circuits, the total average power dissipation, $\bar{P}_{Bt}$, attributed to the conventional balanced driver is given by $$\bar{P}_{Bt} = 2\bar{P}_U + \bar{P}_o. \quad (3)$$

Equation (3) is plotted in FIG. 4 and shows that for $\bar{P}_o = 24$ mW, $\bar{P}_{Bt} = 77.6$ mW, $\bar{P}_{Ut} = 50.8$ mW, the power of an unbalanced driver circuit. Although the drivers 1 and 30 are represented here in ECL technology, equivalent CMOS technology with ECL voltage levels, GaAs, and BiCMOS technologies can also be used to drive terminated transmission lines.

Figure 3:
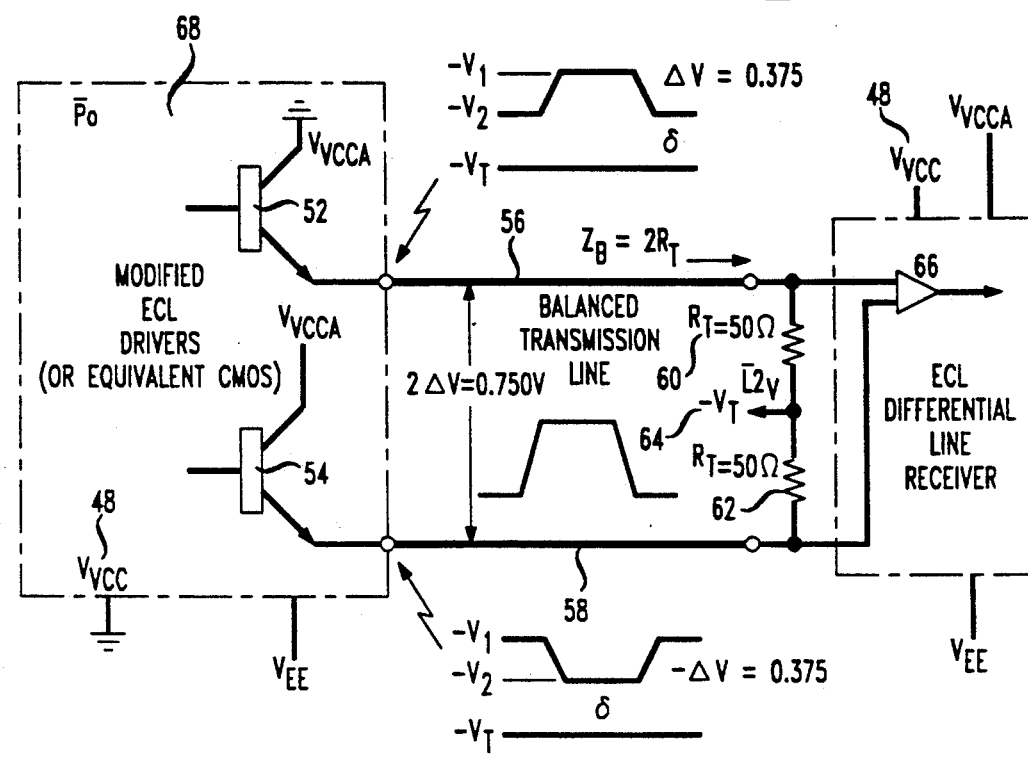
FIG. 3 illustrates a low power balanced transmission line driver according to the invention that uses ECL or equivalent CMOS logic for the on-chip driver circuitry.

The instant invention reduces the power dissipated by a balanced driver 30, by on-chip modifications which modify the voltage swing, $\Delta V$, and voltage levels, $V_1$ and $V_2$, of the balanced driver circuit for a special range of values for $V_T$. For the first time a low power balanced driver circuit 50 can be applied to reduce the amount of inductive noise and conserve power dissipation relative to a comparable unbalanced or balanced driver circuit, while maintaining the minimum collector-current of the emitter followers 52 and 54 above 1 mA. The typical configuration of the inventive low power balanced transmission driver 50 using ECL or BiCMOS technology is presented in FIG. 3. The low power balanced driver 50 is comprised of two emitter follower output stages 52 and 54 which are each connected in series to either a primary or secondary signal lead 56 and 58 which together is referred to as a balanced transmission line having a balanced impedance designated by $Z_B$. Terminating the balanced transmission line 56 and 58 are termination resistors 60 and 62 which have values designated as $R_T$, typically equal to 50 Ω. A voltage supply 64 which has a voltage designated by $-V_T$, approximately in the range of $-1.0$ to $-1.5$ V, is connected to the center-tap of the termination resistors 60 and 62. A receiver 66 is connected in parallel with the termination resistors 60 and 62. The pair of signal leads 56 and 58 are connected to the emitter follower output stages 52 and 54, respectively, located on the integrated circuit 68 so that the current traversing the secondary lead 58 has the same amplitude, but the opposite sign as the current traversing the primary lead 56. Surprisingly, it was discovered that when the voltage swing, $\Delta V$, is in the approximate range of 0.125 to 0.375 V, the voltage supply 64, $-V_T$, is in the approximate range of $-1.0$ to $-1.5$ V, and appropriate on-chip modifications on the integrated circuit 68 were made, voltage levels $V_1$, $V_2$ and voltage difference, $\delta = V_T - V_2$, resulted which, in turn, resulted in significant reduction in power dissipation relative to prior art driver circuits. Additionally, it should be noted that with those modifications and reduction in power dissipation no modifications to the conventional differential line receiver 66 were needed.

Figure 5:
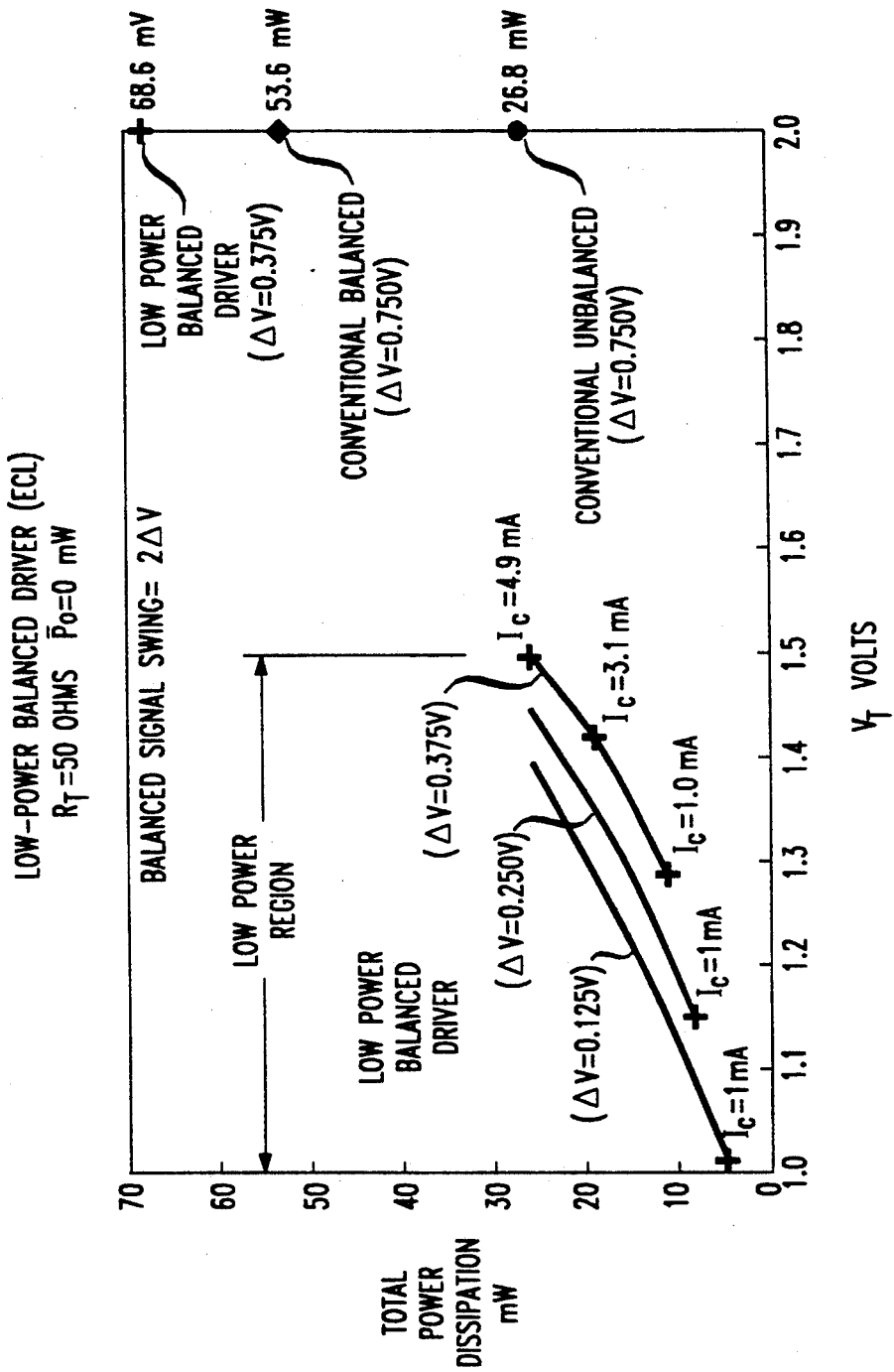
FIG. 5 illustrates the total power dissipation of the low power balanced driver.

Exemplarily, when balanced and unbalanced circuits occupy the same circuit pack and are not segregated during the routing process of the circuit pack, values for $V_T$ and $\Delta V$ are such that $V_T$ is approximately in the range of 1.3 to 1.5 V and $\Delta V$ is approximately equal to 0.375 V, power dissipation is approximately in the range of 13 to 26 mW as illustrated in FIG. 5. For $V_T > 1.5$ V, the power dissipation becomes greater than 26.8 mW, the total power dissipation of the conventional unbalanced driver circuit or the balanced driver circuit of the '767 application. For example, when $V_T$ is equal to 2 V, the power dissipation increases substantially to 68.6 mW as seen in FIG. 5. For $V_T < 1.3$ V, the value of the minimum collector current, $I_c = \delta/R_T$, becomes too close to cutoff and begins to degrade the performance of the circuit. The voltage swing, $\Delta V$, is desirably equal to 0.375 V so that the voltage swing, $2\Delta V = 0.750$ V, propagated on the low power balanced driver circuit (FIG. 3) is equal to the typical ECL voltage swing propagated on the unbalanced driver circuit (FIG. 1). This is important for cross talk purposes when both balanced and unbalanced circuits occupy the same circuit pack. By applying $V_T$, approximately equal to 1.3 to 1.5 V, to the center-tap of the termination resistors 60 and 62, $V_1$ is automatically realized and knowing $V_1$ enables the determination of $V_2 = V_1 + \Delta V$. The appropriate value of $V_2$ is achieved through on-chip modifications to the internal circuitry of the integrated chip 68, exemplary as discussed below.

Further reductions in power dissipation are obtained by reducing the balanced signal swing below $2\Delta V = 0.75$ V. This is especially important when the unbalanced and balanced interconnections are segregated during the routing of the circuit pack. FIG. 5 shows the reduction of power dissipation when $\Delta V$ is in the approximate range of 0.125 to 0.375 V. Again, the minimum collector current, $I_o$, is above 1 mA.

The appropriate values for $V_T$, $\Delta V$, $V_1$ and $V_2$ were determined in relation to the power dissipated by an unbalanced driver circuit. I have found that the total average power dissipation, $\bar{P}'_{Bt}$, attributed to the low power balanced driver 50 is given by $$\bar{P}_{Bt} = 2\bar{P}_U |_{V_T, \delta} + \bar{P}_o \quad (4)$$

where $$\bar{P}_U = \frac{V_T}{2R_T}(2V_T - V_2 - V_1) = \frac{V_T}{2R_T}(2\delta + \Delta V). \quad (5)$$

From equation (5), it is seen that, for a given $R_T$ and $\Delta V$, it is advantageous to reduce both $V_T$ and $\delta$ as much as possible, consistent with the requirement that an acceptable collector current level is maintained.

For ECL technology it was established by experiment that exemplary suitable values for $\Delta V$, $V_T$, $V_1$ are 0.375 V, 1.3 V and 0.863 V respectively. Thus, $V_2 = V_1 + \Delta V = 1.238$ V, and $\delta = V_T - V_2 = 0.062$ V. The value of $V_1$ is realized by applying $V_T = 1.3$ V rather than the normal 2.0 V as for the conventional unbalanced and balanced drivers 1 and 30 in FIGS. 1 and 2. This is a result of the basic diode behavior of the collector to emitter junction when in state $V_1$. The value of $V_2 = 1.238$ V is realized, with ECL drivers, by on-chip modifications which involve changing the value of internal resistors and/or changing the magnitude of the internal current source associated with the basic ECL driver. See i.e. *F100K ECL Logic Databook & Design Guide*, by National Semiconductor, 1990 Edition, Section 7, Chapter 1, which is incorporated herein by reference. Analogous on-chip modifications also apply to BiCMOS, GaAs, and CMOS drivers. By using the above special values of $V_T$ and $\delta$ in equation (4), the total average power dissipation, $\overline{P}'_{Bt}$, can be computed and is presented in FIG. 4 along with $\overline{P}_{Ut}$ and $\overline{P}_{Bt}$. Some special cases of these quantities when $\overline{P}_o = 24$ mW are also presented in Table 1.

TABLE 1

| Driver Type | Point-to-Point Interconnections ($P_o$ = 24 mW, $R_T$ = 50 ohms) | | | | | |
|---|---|---|---|---|---|---|
| | Total Power Dissipation | $V_T$ | $V_2$ | $V_1$ | $\delta$ | $\Delta V$ |
| Conv Bal (FIG. 2) | $\overline{P}_{Bt}$ = 53.6 + $\overline{P}_o$ = 77.6 mW | 2.0 V | 1.705 V | 0.955 V | 0.295 V | 0.750 V |
| Conv Unbal (FIG. 1) | $\overline{P}_{Ut}$ = 26.8 + $\overline{P}_o$ = 50.8 | 2.0 | 1.705 | 0.955 | 0.295 | 0.750 |
| Low Power Bal (FIG. 3) | $\overline{P}'_{Bt}$ = 13.0 + $\overline{P}_o$ = 37.0 | 1.3 | 1.238 | 0.863 | 0.062 | 0.375 |

Thus, remarkably, the low power balanced driver 50 dissipates about 50% less power than the conventional balanced driver 30 and about 25% less power than the conventional unbalanced driver 1.

A similar method can be applied to determine the values $V_T$, $V_2$, $V_1$, and $\delta$ when temperature, voltage, material, and manufacturing variations are considered. Again, one begins by choosing a suitable value for $\Delta V$, in the approximate range of 0.125 to 0.375 V, $V_T$, in the approximate range of 1.0 to 1.5 V, and $V_1$. Then one can determine $V_2 = V_1 + \Delta V$, and $\delta = V_T - V_2$. Finally, the average power dissipation can be computed using equations 4 and 5.

The benefit of significantly reducing the power dissipation by a driver can also be readily seen in bused interconnections. For bused interconnections, any one active driver can send a digital bit stream to multiple receivers. The bus may be unbalanced or balanced. To accomplish this broadcast feature, the drivers are normally provided with a control signal which then allows each driver to have three states: $V_1$, $V_2$, and an off state (i.e. no electrical load on the bus). In operation, only one driver is active and the others are in the "off" state. The active bus driver must drive a load impedance that is one-half the load impedance of the corresponding point-to-point interconnections shown in FIGS. 1, 2 and 3. This additional load typically results in a doubling of the power dissipation in the emitter followers and the load resistors. Thus, the benefit of using low power balanced driver circuits 50 to drive bused interconnections is even greater.

I claim:

1. An article comprising a circuit for driving electrical signal output leads of an integrated circuit comprising:
   first and second transistor output stages each having an output terminal;
   first and second transmission lines, serially connected to said first and second output terminals, respectively, each of said transmission lines having an output end;
   first and second termination resistors connected serially between said first and second transmission line output ends;
   a voltage supply having a voltage $V_T$ approximately in the range of 1.0 to 1.5 volts connected between said first and second termination resistors; and
   a receiver connected between said first and second transmission line output ends;
   wherein the circuit has a voltage swing, $\Delta V = V_2 - V_1$, approximately in the range of 0.125 to 0.375 V, and voltage levels, $V_1$, $V_2$ which result in a significant reduction in power dissipated by the circuit compared to analogous conventional balanced or unbalanced driver circuits.

2. An article according to claim 1 wherein the value of $V_1$ is realized by applying said voltage, $V_T$, to said circuit.

3. An article according to claim 1 wherein the value of $V_2$ is realized by the value of resistors internal to the integrated circuit.

4. An article according to claim 1 wherein the value of $V_2$ is realized by the magnitude of current sources internal to the integrated circuit.

5. An article according to claim 1 wherein the value of $V_2$ is realized by the magnitude of current sources and resistors internal to the integrated circuit.

6. An article according to claim 1 wherein said integrated circuit is implemented using emitter coupled logic.

7. An article according to claim 1 wherein said integrated circuit is implemented using bipolar complementary metaloxide semiconductor logic.

8. An article according to claim 1 wherein said integrated circuit is implemented using GaAs logic.

9. An article according to claim 1 wherein said integrated circuit is implemented using complementary metal oxide semiconductor logic.

10. A method of driving electrical signal output transmission lines of an integrated circuit which reduces the inductive noise, and dissipates substantially less power than a corresponding conventional balanced or unbalanced driver circuit, the method comprising the steps of transmitting a compensating signal on a secondary transmission line associated with each of said signal output transmission lines, applying a voltage, $V_T$, wherein $V_T$ is approximately equal to 1.0 to 1.5 V between a first and second terminating resistor serially connected between said secondary and its associated transmission lines, providing voltages $V_1$ and $V_2$, with $\Delta V = V_1 - V_2$ being in the approximate range of 0.125 to 0.375 V.

* * * * *